US009380385B1

(12) United States Patent
Skinner et al.

(10) Patent No.: US 9,380,385 B1
(45) Date of Patent: Jun. 28, 2016

(54) COMPRESSOR BASED DYNAMIC BASS ENHANCEMENT WITH EQ

(71) Applicants: Scott Skinner, Westborough, MA (US); Christopher M. Hanna, Arlington, MA (US)

(72) Inventors: Scott Skinner, Westborough, MA (US); Christopher M. Hanna, Arlington, MA (US)

(73) Assignee: THAT Corporation, Milford, MA (US)

( * ) Notice: Subject to any disclaimer, the term of this patent is extended or adjusted under 35 U.S.C. 154(b) by 175 days.

(21) Appl. No.: 14/212,906

(22) Filed: Mar. 14, 2014

Related U.S. Application Data

(63) Continuation-in-part of application No. 12/987,056, filed on Jan. 11, 2010, now abandoned, which is a continuation-in-part of application No. 12/619,653, filed on Nov. 16, 2009, now abandoned, and a continuation-in-part of application No. 12/619,655, filed on Nov. 16, 2009, now Pat. No. 8,315,411.

(60) Provisional application No. 61/787,871, filed on Mar. 15, 2013, provisional application No. 61/293,005, filed on Jan. 7, 2010.

(51) Int. Cl.
*H03G 5/00* (2006.01)
*H04R 3/04* (2006.01)
*H04R 29/00* (2006.01)
*H03G 5/16* (2006.01)
*H03G 7/00* (2006.01)
*H04R 3/14* (2006.01)

(52) U.S. Cl.
CPC .............. *H04R 3/04* (2013.01); *H03G 5/165* (2013.01); *H03G 7/002* (2013.01); *H04R 3/14* (2013.01); *H04R 29/001* (2013.01)

(58) Field of Classification Search
None
See application file for complete search history.

(56) References Cited

U.S. PATENT DOCUMENTS

| 4,249,042 A | 2/1981 | Orban |
| 4,412,100 A | 10/1983 | Orban |

(Continued)

FOREIGN PATENT DOCUMENTS

| CN | 1173268 | 2/1998 |
| EP | 0606968 | 7/1994 |

(Continued)

OTHER PUBLICATIONS

Von Recklinghausen, "Dynamic Equalization for Loudspeakers," AES, 65th Conv., London, (1980).

(Continued)

*Primary Examiner* — Muhammad N Edun
(74) *Attorney, Agent, or Firm* — McDermott Will and Emery LLP

(57) ABSTRACT

Systems and methods for enhancing the low frequency response of a loudspeaker for relatively low input level audio signals and protect the loudspeaker for relatively high input level audio signals make use of a crossover network configured so separate an audio input signal into at least two frequency bands including a low frequency band; and a signal compressor responsive to the energy level of the low frequency portion of an input audio signal in the low frequency band and configured to provide amplification gain on the low frequency portion of the input signal when the energy level of the low frequency portion of the input signal is relatively low. One or more peak limiters may be positioned before the summer(s), in the circuit, but after the low band compressor. The EQ unit(s) may be positioned before all processing to the L and R inputs.

15 Claims, 5 Drawing Sheets

(56) References Cited

U.S. PATENT DOCUMENTS

| | | |
|---|---|---|
| 4,460,871 A | 7/1984 | Orban |
| 4,837,824 A | 6/1989 | Orban |
| 4,866,774 A | 9/1989 | Klayman |
| 4,910,778 A | 3/1990 | Barton |
| 5,050,217 A | 9/1991 | Orban |
| 5,054,071 A | 10/1991 | Bacon |
| 5,165,099 A | 11/1992 | Onaya et al. |
| 5,412,731 A | 5/1995 | Desper |
| 5,553,151 A | 9/1996 | Goldberg |
| 5,737,434 A | 4/1998 | Orban |
| 5,778,077 A | 7/1998 | Davidson |
| 5,784,468 A | 7/1998 | Klayman |
| 5,896,456 A | 4/1999 | Desper |
| 6,285,767 B1 | 9/2001 | Klayman |
| 6,552,753 B1 | 4/2003 | Zhurbinskiy et al. |
| 6,859,238 B2 | 2/2005 | Wu |
| 6,993,480 B1 | 1/2006 | Klayman |
| 7,031,474 B1 | 4/2006 | Yuen et al. |
| 7,110,558 B1 | 9/2006 | Elliott |
| 7,251,337 B2 | 7/2007 | Jacobs |
| 7,636,443 B2 * | 12/2009 | Klayman ............ H04S 1/002 381/1 |
| 2004/0105559 A1 | 6/2004 | Aylward et al. |
| 2005/0100178 A1 | 5/2005 | Rybicki et al. |
| 2006/0008096 A1 | 1/2006 | Waller |
| 2006/0062395 A1 | 3/2006 | Klayman et al. |
| 2006/0256980 A1 | 11/2006 | Pritchard |
| 2007/0003075 A1 | 1/2007 | Cooper et al. |
| 2007/0092089 A1 | 4/2007 | Seefeldt et al. |
| 2007/0291959 A1 | 12/2007 | Seefeldt |
| 2008/0069385 A1 | 3/2008 | Revit |
| 2008/0170725 A1 | 7/2008 | Asada |
| 2008/0253586 A1 | 10/2008 | Wei |
| 2008/0273719 A1 | 11/2008 | Chen |
| 2009/0296959 A1 | 12/2009 | Bongiovi |

FOREIGN PATENT DOCUMENTS

| | | |
|---|---|---|
| JP | 9232896 | 9/1997 |
| JP | 11-122060 | 4/1999 |
| TW | 503625 | 9/2002 |
| WO | 02/074013 | 9/2002 |
| WO | 2007085267 | 8/2007 |
| WO | 2010057133 | 5/2010 |
| WO | 2010057134 | 5/2010 |

OTHER PUBLICATIONS

International Search Report and the Written Opinion dated Apr. 11, 2011 from Corresponding PCT Application No. PCT/US2011/002445.

International Search Report and the Written Opinion dated Mar. 1, 2010 from Corresponding PCT Application No. PCT/US2009/064654.

International Search Report and the Written Opinion dated Mar. 1, 2010 from Corresponding PCT Application No. PCT/US2009/064653.

Archibald, "Software Implementation of Automatic Gain Controller for Speech Signal," Texas Instruments White Paper, SPRAAL1, (2008).

Bauer et al., "A Loudness-Level Monitor for Broadcasting.," IEEE Transactions on Audio and Electroacoustics, AE-15 (4):177-182 (1967).

Bogh, "Audio Levels and Readings.," DK-Technologies Supplemental Publication Provided with Manual for Audio Meter. DK-Technologies A/S. Denmark (2007).

DK-Technologies, "Stereo Loudness Meter, MSD100C-Loudness." Technical Data Sheet for MSD100C-Loudness Meter, (2007).

Dolby, "LM100 Broadcast Loudness Meter Technical Data Sheet," Dolby Laboratories (2004).

Giles, Audio/Radio Handbook (D.Bohn), Section 5.2,4 (National Semiconductor Corporation, Santa Clara, California) (1976).

ITU (International Telecommunication Union) Recommendation ITU-R BS. 1770-1, Algorithms to Measure Audio Programme Loudness and True-Peak Audio Level (Question ITU-R 2/6) (2006-2007).

Jones et al., "A New Loudness Indicator for Use in Broadcasting," Originally Published in the JSMPTE, Presented at the 71st Convention of the Audio Engineering Society, Montreux (1982).

Lund, "Control of Loudness in Digital TV in NAB BEC Proceedings" (2006).

Lund, "Stop Counting Samples," Presentation Delivered to the 121st Audio Engineering Society Meeting, San Francisco (2006).

Mooe, "Why Are Commercals So Loud?" Pecepton and Modeling of the Loudness of Amplitude-Compessed Speech. Journal of the Audio Engineering Society, 51(12):1123-1132 (2003).

Skovenborg et al., "Evaluation of Different Loudness Models with Music and Speech Material," Paper Presented to the 117th Convention of the Audio Engineering Society, (2004).

THAT Corporation, "Improving Loudspeaker Signal Handling Capability," Design Note 04 (Formerly Application Note 104) (1999).

THAT Corporation, "High Performance Stereo AGC Based on the THAT 4301," Design Note 118 (2000-2010).

Torick et al., "Automatic Control of Loudness Level," IEEE Transactions on Broadcasting, BC-14(4):143-146 (1968).

* cited by examiner

COMPRESSOR BASED DYNAMIC BASS ENHANCEMENT WITH EQ

CROSS-REFERENCE TO RELATED APPLICATION

This application is a continuation-in-part of U.S. application Ser. No. 12/987,056, entitled "Compressor Based Dynamic Bass Enhancement with EQ," filed Jan. 11, 2010, which claims priority to U.S. provisional patent application 61/293,005, entitled "Compressor Based Dynamic Bass Enhancement," filed on Jan. 7, 2010 in the names of Scott Skinner and Chris Hanna, and assigned to the present assignee; this application is also a continuation-in-part application of U.S. patent application Ser. No. 12/619,653, entitled "Dynamic Volume Control and Multi-Spatial Processing Protection," filed Nov. 16, 2009 in the names of Christopher M. Hanna, Gregory Benulis and Scott Skinner, and assigned to the present assignee, and U.S. patent application Ser. No. 12/619,655, entitled "Dynamic Volume Control and Multi-Spatial Processing Protection", filed Nov. 16, 2009 in the names of Christopher M. Hanna and Gregory Benulis, and assigned to the present assignee, both of the Applications claiming priority from U.S. Provisional Application Nos. 61/114,684 filed on 14 Nov. 2008 in the names of Christopher M. Hanna, Gregory Benulis and Scott Skinner; and 61/114,777 filed on 14 Nov. 2008 in the names of Christopher M Hanna and Gregory Benulis. This application also claims priority to U.S. Provisional Application No. 61/787,871, entitled "Compressor Based Dynamic Bass Enhancement with EQ," filed on Mar. 15, 2013.

The entire content of each of these above-noted applications is incorporated herein by reference.

BACKGROUND

1. Technical Field

This disclosure relates to audio reception and playback, and more particularly to systems for and techniques of enhancing the perceived bass response of inexpensive speakers typically incorporated into audio and video reception and playback devices such as televisions and computers.

2. Description of Related Art

Most consumers are much more sensitive to the quality of visual displays than they are to sound quality. In order to keep cost at a minimum, consumer electronics manufacturers of audio and video systems, such as televisions and computers, thus are more likely to install small, inexpensive speakers in the systems. These speakers typically have poor low frequency (bass) response and become more prone to distortion as the audio frequency moves further below the speaker's low frequency resonance point. For those consumers who are more discerning, the audio and video reception and playback systems are usually configured so that additional speakers can be connected to the audio and video reception and playback systems for improving the quality of the audio portion of any programming.

SUMMARY

The disclosure describes a system for and technique of improving the perceived bass response of such internally mounted speakers of a system that receives and plays back audio programming. The disclosed system and technique also provides enhancement of the amount of bass so that sound appears to be emanating from higher quality, wider bandwidth speakers, without requiring the connection of additional speakers.

More specifically, in accordance with one aspect, a system is provided for enhancing the low frequency response of a loudspeaker for relatively low input level audio signals and protect the loudspeaker for relatively high input level audio signals. The system comprises: a crossover network configured so as to separate an audio input signal into at least two frequency bands including a low frequency band; and a signal compressor responsive to the energy level of the low frequency portion of an input audio signal in the low frequency band and configured to provide amplification gain on the low frequency portion of the input signal when the energy level of the low frequency portion of the input signal is relatively low so as to enhance the low frequency response of the loudspeaker, and attenuation of the low frequency portion of the input signal when the energy level of the low frequency portion of the input signal is relatively high so as to protect the loudspeaker from being overdriven.

In accordance with other aspects, the crossover network is configured to separate the audio signal into two frequency bands, wherein parameters of the system are configurable to optimize for a given speaker characteristic or listener preference. The configurable parameters include one or more of the following: crossover frequency, compression ratio, maximum allowable gain, high pass filter cutoff frequency, and target level. In one embodiment, the compressor includes an RMS based level detector for generating a signal representing the energy level of the low frequency portion of the input audio signal. In accordance with another embodiment, a summing block is provided so as to provide a summed signal as a function of the compressed output of the signal compressor signal provided in each remaining frequency band. A high pass filter can be configured to respond to the summed signal and limit the lowest frequency energy applied to the loudspeaker. Further, a peak limiter can be configured to respond to the summed signal and limit the maximum peak level of signal energy applied to loudspeaker. It should be obvious that the peak limiter could also be placed, in the low band, before the summer and respond to the compressor output. The system can further include a static equalizer configured to respond to the summed signal, the static equalizer including a lower limit greater than or equal to the crossover frequency of the cross over network so that the static equalizer, combined with the compressor, operates as a partially dynamic equalizer. In accordance with one embodiment, the system is configured to enhance the low frequency response of at least two loudspeakers for left and right channel stereo play, the crossover network is configured to separate each left and right channel audio input signals into at least two frequency bands including a low frequency band; and the signal compressor is responsive to the energy level of the low frequency portion of each of the left and right audio input signals in the low frequency band and configured to provide amplification gain on the low frequency portion of each of the left and right channel audio input signals when the energy level of the low frequency portion of each of the signals is relatively low so as to enhance the low frequency response of each of the loudspeakers, and provide attenuation of the low frequency portion of each of the left and right channel audio input signals when the energy level of the low frequency portion of each of the signals is relatively high so as to protect each loudspeaker from being overdriven. Finally, in accordance with another embodiment, the system can include a pair of summing blocks for providing a pair of summed signals as a function of the compressed output signal of the signal compressor of the left channel and the corresponding signals of remaining frequency bands of the left channel, and the compressed output signal of the signal compressor of the right channel and the corresponding signals of the remaining bands of the right channel. The system can further include a signal summer configured to provide a summed compressed signal representing the sum of the compressed output signals of the signal compressor of the left and right channels, and at least two summing blocks for providing left and right channel summed signals as a function of the summed compressed signal and the portion of each left and right channel signal provided in each remaining frequency band.

In accordance with another aspect, a two-band compressor based architecture for use with a loudspeaker is provided. The architecture is configurable as a volume leveler, bass enhancer and speaker protection device.

In accordance with another aspect, a method of enhancing the low frequency response of a loudspeaker is provided for relatively low input level audio signals and protecting the loudspeaker for relatively high input level audio signals. The method comprises: separating an audio input signal into at least two frequency bands including a low frequency band; and compressing the low frequency portion of an input audio signal in the low frequency band so as to provide amplification gain on the low frequency portion of the input signal when the energy level of the low frequency portion of the input signal is relatively low so as to enhance the low frequency response of the loudspeaker, and provide attenuation of the low frequency portion of the input signal when the energy level of the low frequency portion of the input signal is relatively high so as to protect the loudspeaker from being overdriven.

Some embodiments can include that the static EQ block is located or positioned before the crossover. For some embodiments, the static EQ affects the low band; or low band and high band.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings disclose illustrative embodiments. They do not set forth all embodiments. Other embodiments may be used in addition or instead. Details which may be apparent or unnecessary may be omitted to save space or for more effective illustration. Conversely, some embodiments may be practiced without all of the details which are disclosed. When the same numeral appears in different drawings, it refers to the same or like components or steps. In the drawings.

DETAILED DESCRIPTION OF ILLUSTRATIVE EMBODIMENTS

Illustrative embodiments are now discussed. Other embodiments may be used in addition or instead. Details which may be apparent or unnecessary may be omitted to save space or for a more effective presentation. Conversely, some embodiments may be practiced without all of the details which are disclosed.

Figure 1:
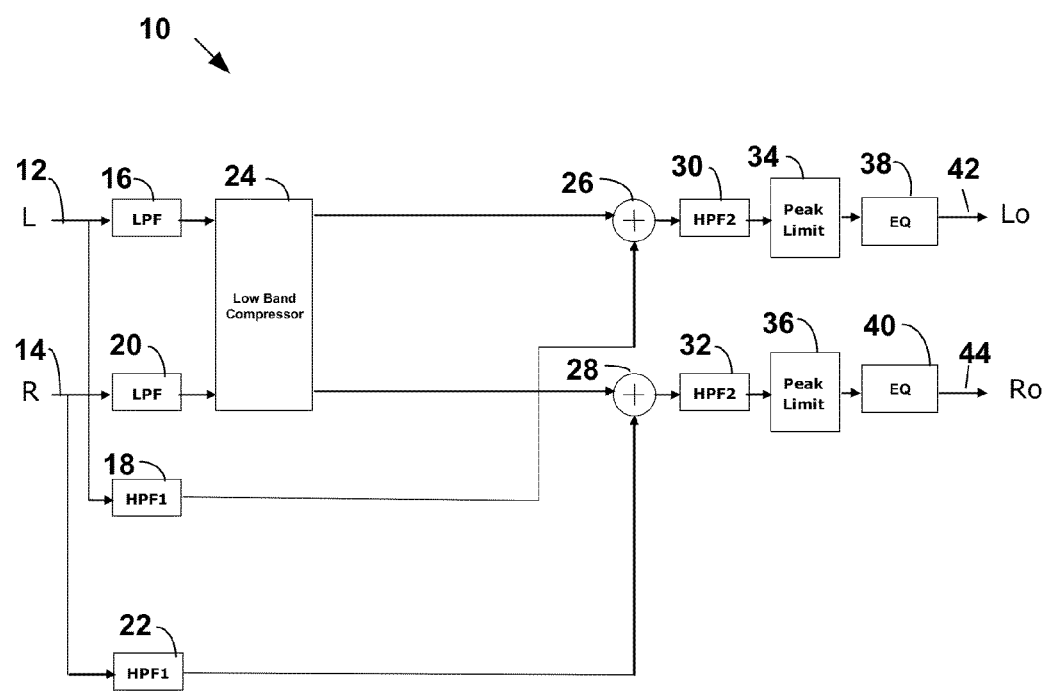
FIG. 1 is a block diagram of one embodiment of a base enhancement system configured so as to improve the perceived bass response, and tonal balance of speakers of the type that are usually mounted internally in systems which include that ability to receive and play audio programming as well as enhance the amount of bass reproduced so that sound appears to be emanating from higher quality, wider bandwidth speakers.

FIG. 1 is a block diagram showing one example of a compressor based bass enhancement system 10 for use in enhancing the bass response of a speaker system. The base enhancement system 10 includes inputs 12 and 14 configured to respectively receive the left and right channel signals of an audio stereo program. Left channel input 12 is coupled to an input of LPF (low pass filter) 16 and an input of HPF1 (high pass filter) 18. Right channel input 14 is coupled to an input of LPF 20 and an input of HPF1 22. The outputs of LPFs 16 and 20 are both connected to a low band compressor 24 configured to compress each signal and provide the compressed signal at a corresponding output of the compressor, wherein the left channel signal is coupled to summing block 26, while the right channel is coupled to summing block 28. Compressing the portion of the audio signal applied to the compressor results in amplifying small signals and attenuating large signals passed through the compressor; alternate embodiments may optionally apply unity gain for signals somewhere in the middle. The summing blocks 26 and 28 are also coupled to the outputs of HPF1 and HPF2 30 and 32, respectively, so that block 26 provides a summed signal as a function of the left channel signal output of the compressor 24 and the left channel signal output of HPF1 18. Similarly, block 28 provides a summed signal as a function of the right channel signal output of the compressor 24 and the right channel signal output of HPF1 22. The left channel summed signal output of the block 26 is then applied to the input of a second HPF2 30, and the right channel summed signal output of block 28 is applied to the input of the second HPF 32. The output of each filter HPF2 30 and HPF2 32 is applied to a respective peak limiter 34 and 36. The latter limits the peak levels of the respective signals applied to the limiters. The output of limiter 34 is applied to equalizer (EQ) 38 configured to provide at least a two band equalization function on the signal applied to the equalizer. EQ 38 provides the left channel output signal Lo at output 42. Similarly, the output of limiter 36 is applied to EQ 40 configured to provide at least a two band equalization function on the signal applied to the equalizer. EQ 40 provides the left channel output signal Ro at output 44. In accordance with one embodiment, each EQ 38 and 40 is a static equalizer configured to respond to the signal applied at its input and establish a lower limit above the crossover frequency of the cross over network formed by filters 16, 18, 20 and 22 so that each static equalizer EQ 38 and 40, when combined with the compressor output, operates as a partially dynamic equalizer over the full audio band.

The LPFs 16 and 20, HPF1s 18 and 22, low band compressor 24 and summing blocks 26, 28 thus combine to form a two-band crossover based architecture. The architecture of the low band compressor 24 can be similar to the dynamic volume control arrangement shown and described in the Co-pending Applications.

Figure 2:
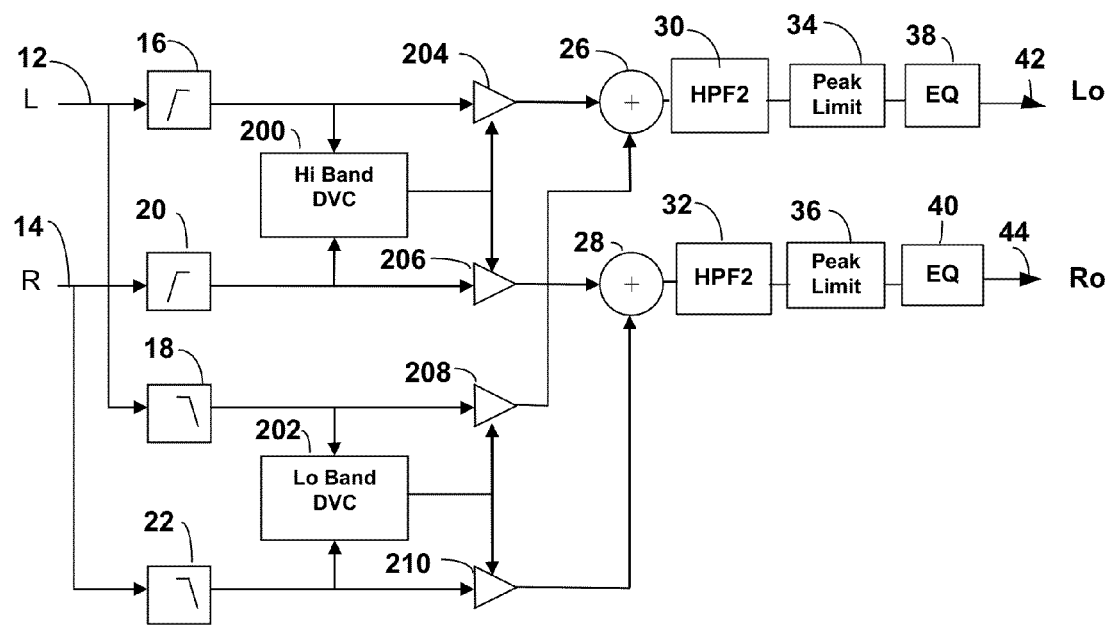
FIG. 2 is a block diagram of the low band compressor shown and described with respect to FIGS. 1 and 5.

For example as shown in FIG. 2, the outputs of the left channel HPF 16 and right channel HPF 20 are applied to the Hi Band DVC 200, while the outputs of the left channel LPF 18 and right channel LPF 22 are applied to the inputs of Lo Band DVC 202. The output of Hi Band DVC 200 controls the gain of amplifier 204 which receives the left channel output of HPF 16, and controls the gain of amplifier 206 which receives the right channel output of right channel HPF 20. The outputs of amplifiers 204 and 206 are respectively applied to the summing blocks 26 and 28, respectively. Similarly, the output of Lo Band DVC 202 controls the gain of amplifier 208 which receives the left channel output of LPF 18, and the gain of amplifier 210 which receives the right channel output of LPF 22. The outputs of amplifiers 208 and 210 are respectively applied to the summing blocks 26 and 28. It should be noted that by changing the compression ratio of the Hi Band DVC 200 to 1:1 so that the gain applied to amplifiers 204 and 206 is unity gain, the outputs of the left channel HPF 16 and right channel HPF 20 pass through the amplifiers to the respective summing blocks 26 and 28 unchanged. Further, the Lo Band DVC 202 can be adjusted for various parameters including changing the target level, compression ratio, attack time constant and release time constant to model the dynamic bass boost function all tailored to the specific speaker systems receiving the Lo and Ro outputs. In one embodiment the Lo Band DVC and Hi Band DVC each include an RMS level detector for use in controlling the gains of the corresponding amplifiers 204, 206 and amplifiers 208 and 210. Further, amplifiers 204, 206, 208 and 210 can each be in the form of voltage control amplifiers. It should be appreciated that other architectures and components can be used. For example, one can use other types of signal compressors as well as other types of level detectors including peak and averaging detectors.

Referring again to FIG. 1, the compressor outputs of compressor 24 are summed with the high band energy provided at the outputs of HPF1 18 and 22 so as to complete the crossover network. HPF2 30 and 32 limit the lowest frequency that reaches each of the loudspeakers. This prevents the lowest frequencies that cannot be reasonably reproduced from reaching the speaker driver. Occasionally, the compressor may briefly provide too much gain (overshoot) to the input low band audio signal. The Peak limiter is provided to protect the speaker from this phenomenon. The peak limiter is positioned after the crossover network to limit the combined low and high band audio peaks to prevent overdriving the speaker. The Equalizer (EQ) can be used to flatten, and extend, the speaker frequency response at those frequencies above the low band. The combination of improved tonal balance (EQ) and improved low frequency response (compressor based dynamic boost) can make a dramatic improvement in the fidelity of small speakers.

The compressor target level is set relatively high when compared to typical input signal bass frequency levels. This results in the compressor typically adding gain to the left and right low band audio input signals in order to maintain the desired low band output level. The amount of gain is controlled both by the compressor target level and the compression ratio. The amount of bass enhancement can be increased by increasing the target compressor target level. The amount of bass enhancement can be decreased by decreasing the compressor target level. The amount of bass enhancement is dynamic since the gain (or attenuation) applied to the left and right input audio is a function of the input level. In one implementation the compressor has a maximum gain limit. This limit helps minimize the compressor's affect on the tonal balance of the audio. In addition to bass enhancement, the speakers are also protected from high levels of low-band energy. The compressor will attenuate the input left and right audio when the level exceeds the compressor target level. The compressor target level is typically adjusted to a level just below where the low band audio begins to distort the speaker. It should be clear that the parameters such as crossover frequency, target level, HPF2 cutoff frequency, peak limit, maximum gain limit and EQ configuration can be adjusted, for optimal performance, for a given speaker.

Figure 3:
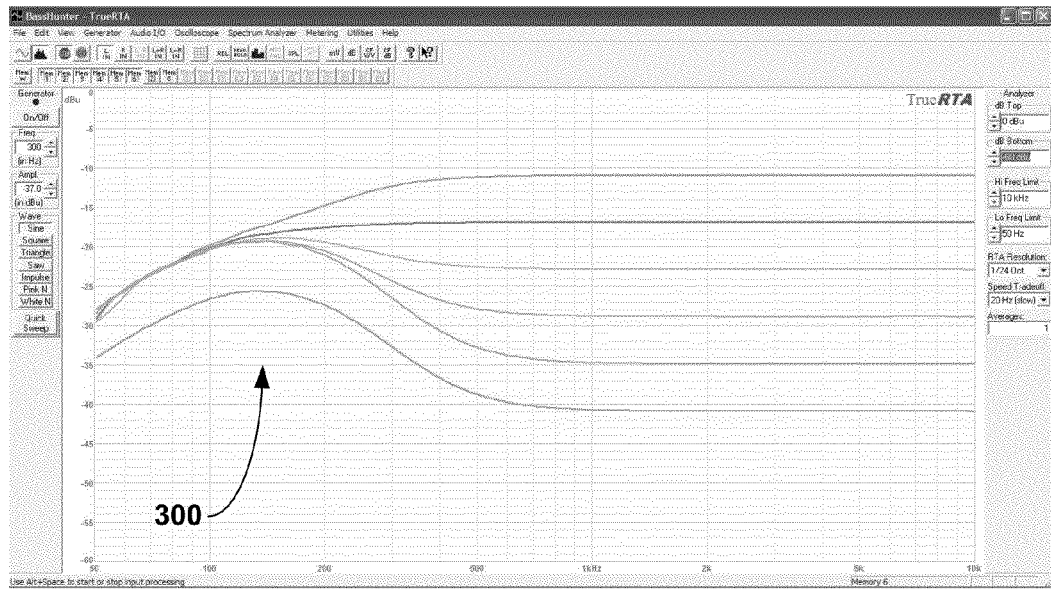
FIG. 3 is an example of a typical frequency response plot of one of the bass enhanced outputs (Lo or Ro in FIG. 1) for different input levels.

FIG. 3 shows one example of a frequency response plot of one of the bass enhancer outputs (Lo or Ro in FIG. 1) for different input levels. The input level is increased in 6 dB steps. The excitation is a quick sine wave sweep (20-20 KHz in less than a second). EQ 38 and 40 were bypassed when this plot was generated.

The high band of the FIG. 3 response remains flat since it is passed unmodified. It exhibits the 6 dB level change of each sweep. The low band is boosted proportional to the input level. Reference is made to the level changes with each sweep around 150 Hz, indicated in FIG. 2 at 300. In the low band the first two lowest input levels exhibit significant boost. The fact that the two lowest level curves are still about 6 dB apart, in the low band, indicates that the compressor 24 has achieved maximum gain. At these input levels the compressor 24 acts like a fixed boost. As the input level continues to increase, less boost is added as the input level approaches the compressor target level. Eventually, the frequency response is flat. As the input level increases, compressor 24 introduces low band attenuation in order to protect the speaker from being driven at levels which would cause high distortion. When the target level is chosen slightly below the maximum low frequency drive level, the compressor based bass enhancement system provides as much boost as possible without driving the speaker into distortion. When this feature is combined with high band EQ (to flatten the speaker high band response) small inexpensive speakers exhibit much improved fidelity.

Figure 4:
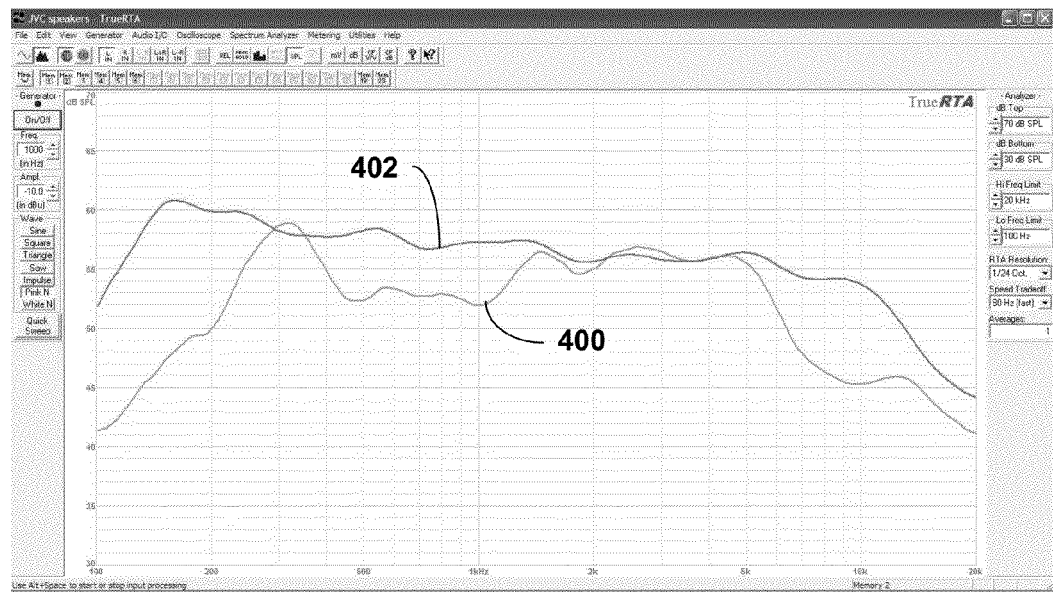
FIG. 4 is an example of the actual measured output of a sample set of small speakers of the type incorporated into audio and video systems.

FIG. 4 shows the actual measured output of a sample set of small speakers. The lowest level input response shown at 400 represents the speakers without EQ or low band compressor processing. The speakers have limited bandwidth and do not have a flat response. The next response at 402 represents the same input level after low band bass enhancement and high band EQ. The response is now relatively flat from 150 Hz to 10 KHz.

Figure 5:
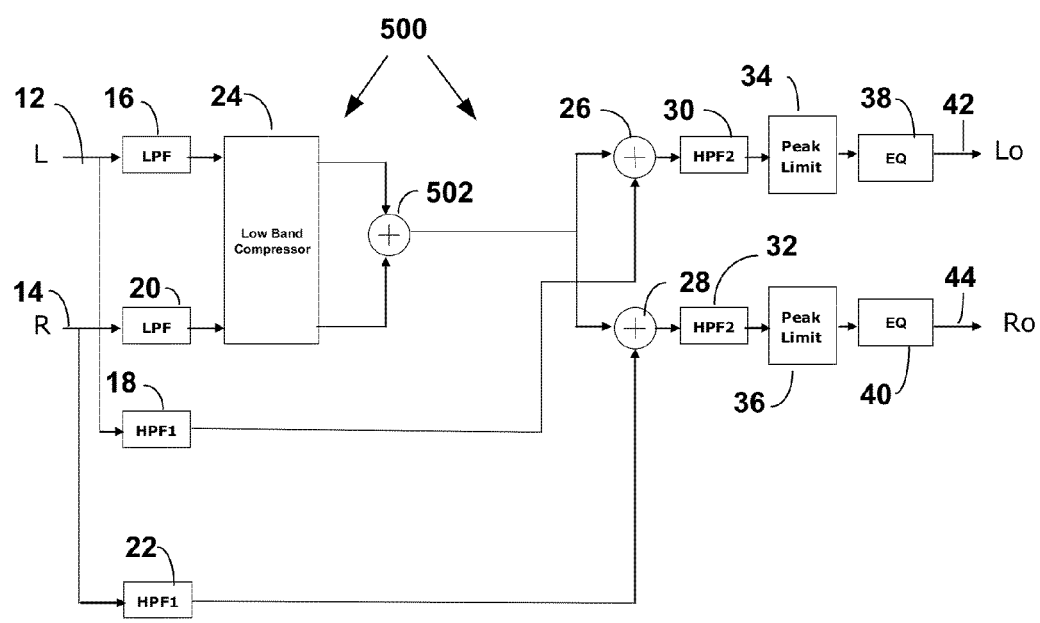
FIG. 5 is a block diagram of an embodiment of a bass enhancement system configured to sum the low band signal to mono.

In some instances it is desirable to provide bass enhancement equally to both speakers. FIG. 5 shows a version of the bass enhancement system 500 which includes a summing block 502 configured to sum the low band signals of each channel to provide a monophonic signal, which in turn is applied to each of summing blocks 26 and 28. After the compressor, the L and R signals are attenuated by 6 dB and summed together to create a mono low band signal. This distributes the bass energy equally between the two speakers and can result in more overall perceived bass.

Figure 6:
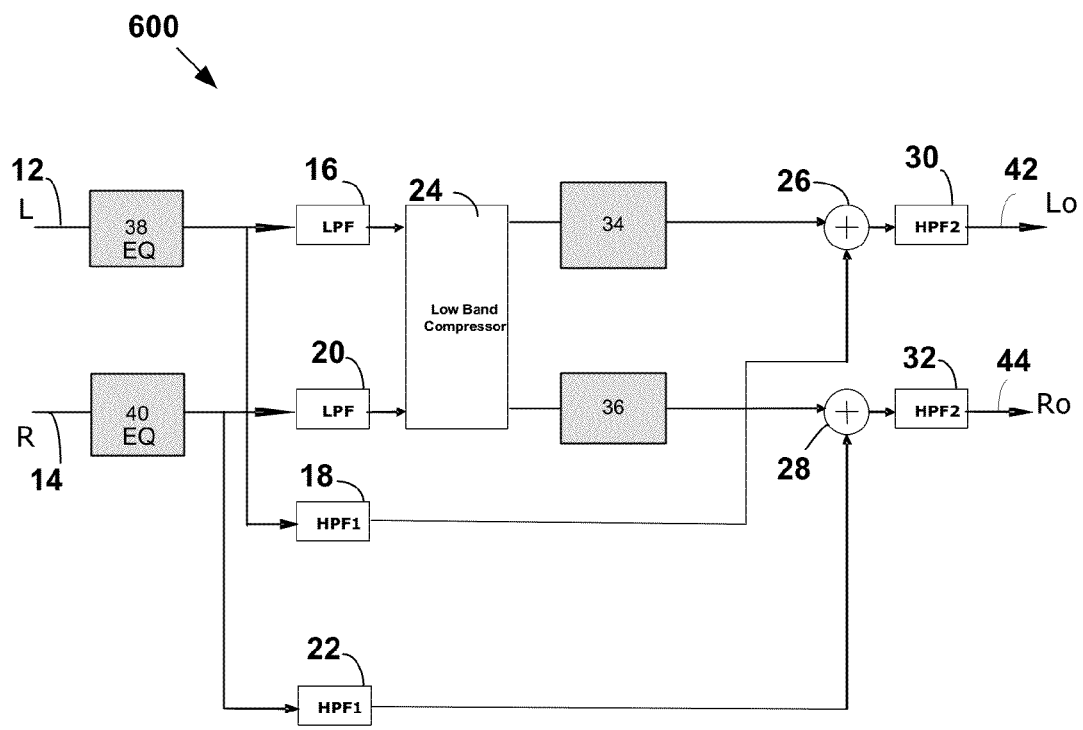
FIG. 6 is a block diagram of a further embodiment.

FIG. 6 depicts a block diagram of a further embodiment of a compressor based bass enhancement system 600 for use in enhancing the bass response of a speaker system. System 600 is similar to system 10 of FIG. 1, with some modifications. In the drawing, the peak limiters 34 and 36 are positioned before the summers 26 and 28, in the circuit, but after the low band compressor 24. In addition, the EQ 38 and 40 are positioned before all processing to the L and R inputs 12 and 14.

As shown in FIG. 6, one or more peak limiters (e.g., 34 and 36) can be positioned at another desired location in the system/circuit 600, e.g., immediately after the Low Band Compressor 24. In this manner, from this layout, brief signal excursions, above the compressor target level, will still be limited before they can overdrive the speaker. If the compressor attack time is short enough, a simple clipper can be used instead of (or in addition to) a more sophisticated peak limiter.

In some embodiments, (e.g., as shown in FIG. 6) an EQ can be positioned at another desired location in the system/circuit 600, e.g., before the LPF and Low Band Compressor which allows the compressor to directly target the maximum low band output level desired for a given speaker system. Each static equalizer can be configured with a lower (frequency) limit that is below the crossover frequency. This can allow the low band response to be spectrally shaped prior to the gain or attenuation effect of the compressor 24. In this configuration the nature of the static EQ can be changed without requiring compensatory adjustment of the Low Band Compressor target level. Further, via the adjustable compressor parameters, the compressor maximum gain limit can be set to 0 dB which results in the static EQ providing the low band adjustment and the compressor only functioning to limit the maximum low band level.

The components, steps, features, objects, benefits and advantages which have been discussed are merely illustrative. None of them, nor the discussions relating to them, are intended to limit the scope of protection in any way. Numerous other embodiments are also contemplated. These include embodiments which have fewer, additional, and/or different components, steps, features, objects, benefits and advantages. These also include embodiments in which the components and/or steps are arranged and/or ordered differently.

For example, while the system has been described as employing two frequency bands, the system can employ any number of bands when additional signal processing of individual bands is desirable Unless otherwise stated, all measurements, values, ratings, positions, magnitudes, sizes, and other specifications which are set forth in this specification, including in the claims which follow, are approximate, not exact. They are intended to have a reasonable range which is consistent with the functions to which they relate and with what is customary in the art to which they pertain.

All articles, patents, patent applications, and other publications which have been cited in this disclosure are hereby incorporated herein by reference.

The phrase "means for" when used in a claim is intended to and should be interpreted to embrace the corresponding structures and materials which have been described and their equivalents. Similarly, the phrase "step for" when used in a claim is intended to and should be interpreted to embrace the corresponding acts which have been described and their equivalents. The absence of these phrases in a claim mean that the claim is not intended to and should not be interpreted to be limited to any of the corresponding structures, materials, or acts or to their equivalents.

Nothing which has been stated or illustrated is intended or should be interpreted to cause a dedication of any component, step, feature, object, benefit, advantage, or equivalent to the public, regardless of whether it is recited in the claims.

The scope of protection is limited solely by the claims which now follow. That scope is intended and should be interpreted to be as broad as is consistent with the ordinary meaning of the language which is used in the claims when interpreted in light of this specification and the prosecution history which follows and to encompass all structural and functional equivalents.

EXEMPLARY EMBODIMENTS

As is shown and described herein some embodiments can include that the static EQ block is located or positioned before the crossover. For some embodiments, the static EQ affects the low band.

The following clauses pertain to exemplary embodiments.

1. A system for enhancing the low frequency response of a loudspeaker for relatively low input level audio signals and protect the loudspeaker for relatively high input level audio signals, the system including: a crossover network configured so as to separate an audio input signal into at least two frequency bands including a low frequency band; and a dynamic system responsive to the energy level of the low frequency portion of an input audio signal in the low frequency band and configured to provide amplification gain on the low frequency portion of the input signal when the energy level of the low frequency portion of the input signal is relatively low so as to enhance the low frequency response of the loudspeaker, and provide attenuation of the low frequency portion of the input signal when the energy level of the low frequency portion of the input signal is relatively high so as to protect the loudspeaker from being overdriven.

2. A system according to clause 1, wherein the crossover network is configured to separate the audio signal into two frequency bands.

3. A system according to clause 1, wherein parameters of the system are configurable to optimize for a given speaker characteristic or listener preference.

4. A system according to clause 2, wherein the configurable parameters include one or more of the following: crossover frequency and maximum allowable gain.

5. A system according to clause 1 cascaded with a static EQ such that the combination produces an overall frequency response made up of both dynamic and static frequency bands.

6. A system according to clause 2, wherein the configurable parameters include crossover frequency, maximum allowable gain and EQ filter coefficients.

What is claimed is:

1. A system for enhancing the low frequency response of a loudspeaker for relatively low input level audio signals and protecting the loudspeaker for relatively high input level audio signals, the system comprising:
  a crossover network configured so as to separate each of left and right audio input signals into at least two frequency bands including a low frequency band;
  a dynamic system including a low band compressor configured to produce outputs signals responsive to the energy level of the low frequency portion of input audio signals in the low frequency band of each of the left and right audio input signals, and configured to provide amplification gain on the low frequency portion of each input signal when the energy level of the low frequency portion of the input signal is relatively low so as to enhance the low frequency response of the loudspeaker, and provide attenuation of the low frequency portion of each input signal when the energy level of the low frequency portion of the input signal is relatively high so as to protect the loudspeaker from being overdriven, wherein the output signals are compressed outputs signals corresponding to the low frequency portion of each of the left and right audio input signals, respectively;
  left and right equalizers configured to receive the left and right audio input signals and shape the spectral characteristics as desired for input to the dynamic system; and
  left and right peak limiters, each configured to receive to the compressed output signals of the dynamic systems, respectively, and to limit the peak amplitude of the compressed output signals, respectively, and provide the compressed output signals to the signal summer.

2. A system according to claim 1, wherein each static equalizer is configured with a lower frequency limit that is below a crossover frequency of the crossover network.

3. A system according to claim 2, wherein the configurable parameters include one or more of the following: crossover frequency and maximum allowable gain.

4. A system according to claim 2, wherein the configurable parameters include crossover frequency, maximum allowable gain, and EQ filter coefficients.

5. A system according to claim 1, wherein parameters of the system are configurable to optimize for a given speaker characteristic or listener preference.

6. A system according to claim 1 cascaded with a static EQ such that the combination produces an overall frequency response made up of both dynamic and static frequency bands.

7. A system according to claim 1, further comprising two loudspeakers for left and right channel stereo play, each being operative to receive an input signal and to produce a corresponding auditory output signal.

8. A system for enhancing the low frequency response of at least two loudspeakers for left and right channel stereo play for relatively low input level audio signals and for protecting the loudspeakers for relatively high input level audio signals, the system comprising:
  a crossover network configured to receive left and right channel audio input signals and separate each into at least two frequency bands including a low frequency band; and
  a signal compressor responsive to the energy level of the low frequency portion of each of the left and right audio input signals and configured to provide amplification gain on the low frequency portion of the input signal when the energy level of the low frequency portion of the input signal is relatively low so as to enhance the low frequency response of the loudspeaker, and provide attenuation of the low frequency portion of the input signal when the energy level of the low frequency portion of the input signal is relatively high so as to protect the loudspeaker from being overdriven, wherein the signal compressor is further configured to provide as output signals compressed outputs signals corresponding to the low frequency portion of each of the left and right audio input signals, respectively; and
  a signal summer configured to provide a summed compressed signal representing the sum of the compressed output signals of the signal compressor of the left and right channels, the signal summer including two summing blocks for providing left and right channel summed signals as a function of the summed compressed signal and the portion of each left and right channel signal provided in each remaining frequency band; and
  peak limiters configured before the two summing blocks and after the signal compressor, wherein the peak limiters are configured to receive the compressed output signals of the signal compressor of the left and right channels, respectively, and to limit the peak amplitude of the compressed output signals, respectively, and provide the compressed output signals to the signal summer.

9. A system according to claim 8, wherein the crossover network is configured to separate the audio signal into two frequency bands.

10. A system according to claim 8, wherein parameters of the system are configurable to optimize for a given speaker characteristic or listener preference.

11. A system according to claim 10, wherein the configurable parameters include one or more of crossover frequency and maximum allowable gain.

12. A system according to claim 10, wherein the configurable parameters include one or more of target level, compression ratio, attack time constant and release time constant.

13. A system according to claim 8 cascaded with a static EQ such that the combination produces an overall frequency response made up of both dynamic and static frequency bands.

14. A system according to claim 13, wherein the configurable parameters include crossover frequency, maximum allowable gain, and EQ filter coefficients.

15. A system according to claim 8, further comprising two loudspeakers for left and right channel stereo play, each being operative to receive an input signal and to produce a corresponding auditory output signal.

* * * * *